United States Patent
Ganeshan

(10) Patent No.: US 7,834,703 B2
(45) Date of Patent: Nov. 16, 2010

(54) AMPLIFIER WITH SINGLE-ENDED INPUT AND DIFFERENTIAL OUTPUT

(75) Inventor: Saravana Kumar Ganeshan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 12/193,744

(22) Filed: Aug. 19, 2008

(65) Prior Publication Data

US 2010/0046677 A1 Feb. 25, 2010

(51) Int. Cl.
*H03F 3/04* (2006.01)
(52) U.S. Cl. .................................. 330/301; 330/117
(58) Field of Classification Search .................. 330/301, 330/117, 311
See application file for complete search history.

(56) References Cited

U.S. PATENT DOCUMENTS 7,224,231 B2 * 5/2007 Wu ............................. 330/301
7,538,618 B2 * 5/2009 Park et al. .................... 330/301

* cited by examiner

*Primary Examiner*—Henry K Choe
(74) *Attorney, Agent, or Firm*—Ronald O. Neerings; Wade James Brady, III; Frederick J. Telecky, Jr.

(57) ABSTRACT

An amplifier provided according to an aspect of the present invention includes a set of passive impedances forming a tuned load to a gain stage and also to provide a 180 degrees phase shifted signal of a gain signal received from the gain stage. The output of the gain stage and the 180 degrees phase shifted signal together form a differential amplified signal corresponding to an input signal gained by the gain stage. In an embodiment, the set of passive impedances includes a three terminal centre tapped inductor in combination with a capacitor, together operating as a filter to pass only a desired frequency band. The windings of the inductor may be designed to provide mutual coupling between two portions such that there is a negative correlation between the strength of the received gained signal and the 180 degree phase shifted signal.

15 Claims, 3 Drawing Sheets

AMPLIFIER WITH SINGLE-ENDED INPUT AND DIFFERENTIAL OUTPUT

BACKGROUND

1. Field of the Invention

The present invention relates generally to amplifiers, and more specifically to an improved amplifier with single-ended input and differential output.

2. Related Art

Amplifiers are often employed to amplify (enhance the signal level/strength of) signals. In general, an amplifier amplifies an input signal to generate an amplified output signal. For example, amplifiers are employed in, but not limited to, radio receivers and transmitters, Analog to Digital Converters (ADCs), etc.

An amplifier may receive an input signal in single-ended or differential form. A single-ended signal (input or output) generally refers to a signal provided on a single path, with the strength (e.g., voltage) of the signal being referenced to (measured with respect to) a reference potential terminal such as a ground. On the other hand, a differential signal is a signal provided on two separate paths, with the strength of the signal being determined by a difference of the strengths on the two paths.

Several environments require an amplifier to receive an input signal in single-ended form (also termed unbalanced), and provide a corresponding amplified output in differential form (also termed balanced or double-ended). At least in some of such environments, such amplifiers may need to be implemented while ensuring one or more requirements, such as low power consumption, smaller implementation area, low noise etc.

Several aspects of the present invention provide an improved amplifier with single-ended input and differential output meeting one or more of such requirements.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An amplifier provided according to an aspect of the present invention includes a set of passive impedances forming a tuned load to a gain stage and also to provide a 180 degrees phase shifted signal of a gain signal received from the gain stage. The output of the gain stage and the 180 degrees phase shifted signal together form a differential amplified signal corresponding to an input signal gained by the gain stage.

In an embodiment, the set of impedances includes a three terminal centre tapped inductor in combination with a capacitor, together operating as a filter to pass only a desired frequency band. The windings of the inductor may be designed to provide mutual coupling between two portions such that there is a negative correlation between the strength of the received gained signal and the 180 degree phase shifted signal.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
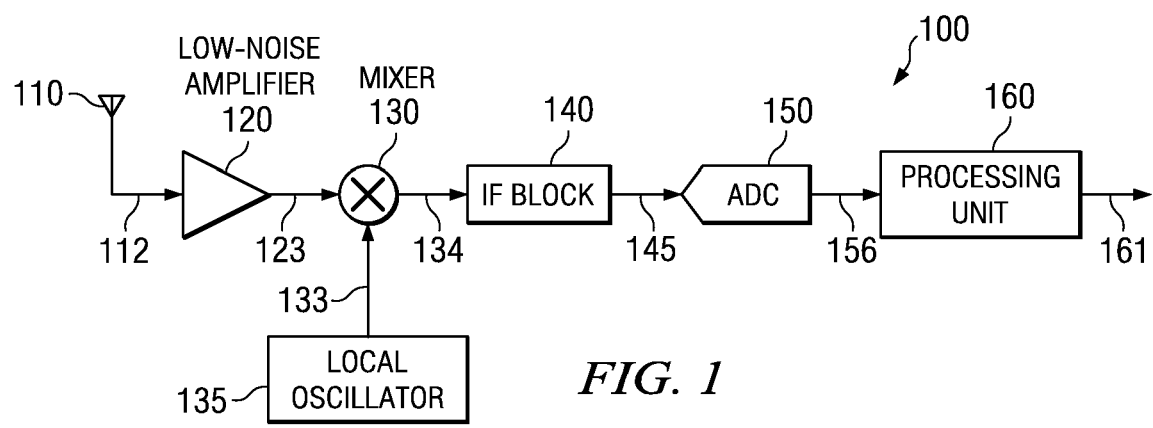
FIG. 1 is a block diagram illustrating the details of an example device/system in which several aspects of the present invention can be implemented.

FIG. 1 is a block diagram illustrating the details of an example device/system in which several aspects of the present invention can be implemented. The device/system of FIG. 1 is shown merely by way of illustration. However, several features of the present invention can be implemented in other environments, with fewer/more number/types of components, as well.

In FIG. 1, radio Frequency (RF) receiver 100 is shown containing antenna 110, low-noise amplifier (LNA) 120, mixer 130, local oscillator (LO) 135, intermediate Frequency (IF) block 140, analog to digital converter (ADC) 150 and processing unit 160. Receiver 100 may correspond, for example, to portions of a global positioning system (GPS) receiver, Bluetooth receiver, etc. Each block/unit of receiver 100 is described in detail below.

Antenna 110 receives a radio frequency signal and forwards the signal to LNA 120 on path 112. LNA 120 amplifies the input signal received on path 112, and provides an amplified output on path 123. LNA 120 may be designed to have a low noise figure (NF), and may thus add only very little noise to the input signal.

Mixer 130 mixes (for example, by a multiplication operation) the amplified signal on path 123 with a local oscillator (LO) signal received via path 133 from LO 135. The mixing operation is typically performed to down-convert input 112 to a lower frequency band. Although not shown separately, mixer 130 may contain corresponding filters (for example, low pass filter) to select the desired lower frequency band (provided on path 134) from the results of the mixing process, as is well known in the relevant arts.

IF block 140 performs IF processing operations such as one or more further levels of down-conversion, amplification of the corresponding down-converted signals, filtering, etc., and provides a final down-converted signal (path 145) to ADC 150. ADC 150 converts the received analog signal, and generates digital codes representing the analog signal at corresponding (sampling) instances of time. ADC 150 forwards the digital codes to processing unit 160 on path 156.

Processing unit 160 may perform several operations to recover the information contained in the digital codes. The operations may include, demodulation, further processing to provide desired information as output on path 161, etc.

LNA 120 is implemented as a single-ended input/differential output amplifier, i.e., LNA 120 receives signal 112 in single-ended form, and provides amplified signal 123 in differential form.

One reason, for example, why it may be desirable for LNA 120 to be able to accept signal 112 in single-ended form may be due to antenna 110 being typically implemented to provide signal 112 in single ended form. Although a balun (4-terminal balanced-line to unbalanced-line converter, well known in the relevant arts) may be used to convert a single-ended output of antenna 110 to a differential output, use of a balun generally causes signal strength loss/reduction, adds to the total component count of receiver 100, and thus may not be desirable.

It may be desirable for LNA 120 to provide an amplified signal in differential form at least to reject/reduce common mode noise (like power supply noise, substrate noise, etc.). Other reasons may include enabling the blocks following LNA 120 (IF block 140 and ADC 150) to be implemented to process signals in differential form, which may enable meeting second order intercept point (IIP2, a measure quantifying the extent of second-order non-linearity) of such blocks, rejecting common mode noise in such blocks, etc.

LNA 120, implemented as a single-ended input to differential output amplifier, may further need to meet various requirements, such as low power consumption, low noise (low noise figure), smaller implementation area etc. A few examples of prior amplifiers with single-ended input and differential output are described next.

3. Prior Amplifiers

Figure 2:
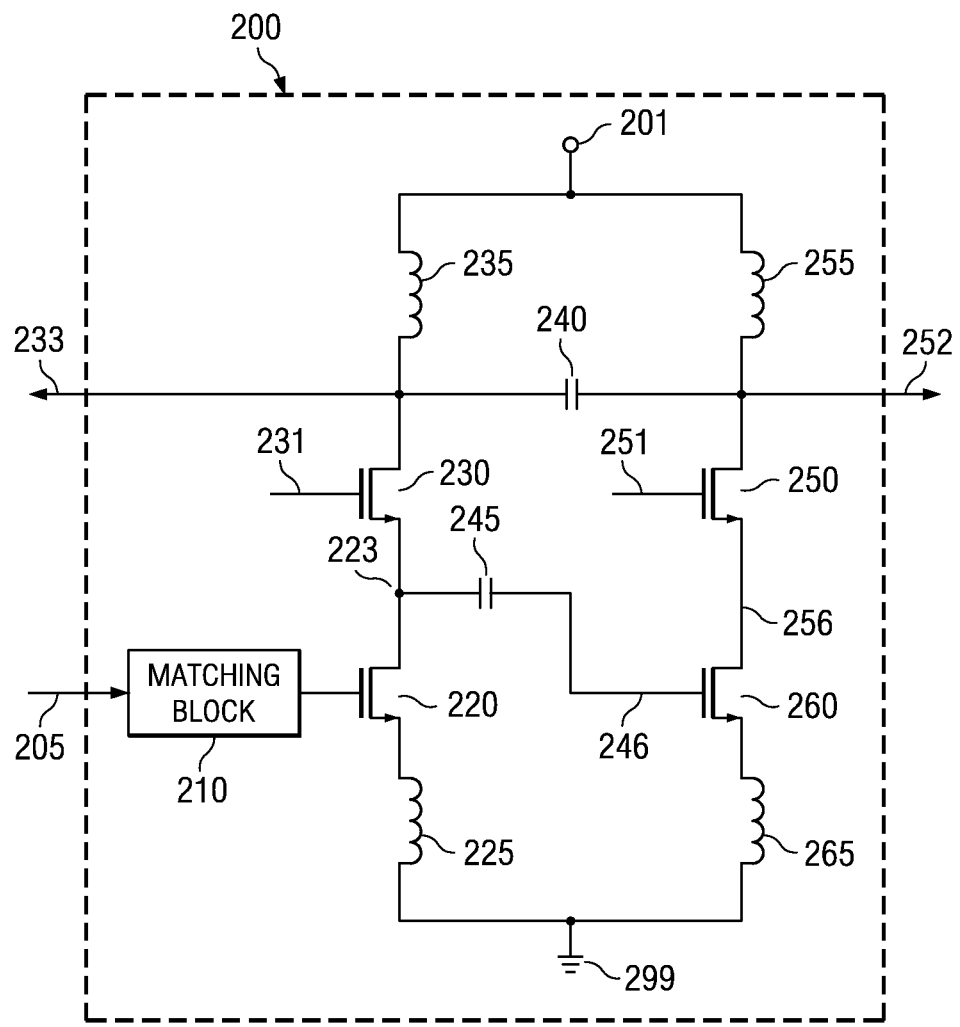
FIG. 2 is a circuit diagram illustrating the details of a prior amplifier with single-ended input and differential output.

FIG. 2 is a diagram illustrating the details of a prior amplifier with single-ended input and differential output. Prior amplifier 200 (which may be designed to be a low noise amplifier) is shown containing matching block 210, transistors 220, 230, 250 and 260, inductors 235 and 255, inductors 225 and 265, and capacitors 240 and 245. Terminals 201 and 299 respectively represent power supply and ground terminals, each of which may be viewed as a corresponding reference potential.

Matching block 210 receives an input (e.g., from an antenna, not shown) on path 205, and provides a controlled impedance path (impedance matching) for input 205. Input 205 is passed via matching block 210 to a control terminal (e.g., gate terminal) of transistor 220.

Gate terminal, source terminal and drain terminal of transistor 220 are respectively connected to the output of matching block 210, a terminal of inductor 225, and node 223. Gate terminal, source terminal and drain terminal of transistor 230 are respectively connected to an internally generated bias voltage 231, node 223 and a terminal of inductor 235. The second terminals of inductors 225 and 235 are respectively connected to ground and power supply potentials.

Source terminal and drain terminal of transistor 260 are respectively connected to a terminal of inductor 265 and node 256. Gate terminal, source terminal and drain terminal of transistor 250 are respectively connected to an internally generated bias voltage 251, node 256 and a terminal of inductor 255. The second terminals of inductors 265 and 255 are respectively connected to ground and power supply potentials. Each of transistors 220, 230, 250 and 260 may be implemented, for example, as a CMOS transistor.

Capacitor 245 is connected between node 223 and gate terminal of transistor 260. Capacitor 240 is connected between differential output nodes 233 and 252. Inductors 235, 255 and capacitor 240 in combination present a tuned load to amplifier 200, with their respective values being selected corresponding to a desired band of frequencies of signal 205. The operation of amplifier 200 in generating a differential output (233/252) from a single-ended input 205 is briefly noted below.

Assuming a single-ended input sine wave is applied at terminal 205, and that the input is rising in magnitude, voltage at node 223 will start reducing. Thus, there is a 180 degree phase shift between input 205 and the signal at node 223. Thus, node 233 provides a 180 degrees phase-shifted (out of phase) version of signal 205, and is thus the negative terminal of the differential output pair 233/252.

Signal at node 233 is coupled to node 246 (gate terminal of transistor 260), and is has the same phase as signal 223 (i.e., 180 degrees shifted from signal 205). Signal at node 256 is consequently phase-shifted 180 degrees with respect to signal 245, and therefore 360 degrees (or 0 degrees with respect to signal 205). Thus, node 252 provides a 0 degrees phase-shifted (in-phase) version of signal 205, and is thus the positive terminal of the differential output pair 233/252. Transistors 230 and 250, each with its gate terminal at a fixed (constant) bias operate to provide some level of isolation between input 205, and differential outputs 233/252.

It may be observed with respect to amplifier 200 that conversion from single-ended (signal 205) to differential output (233/252) is achieved by using an auxiliary arm (path containing transistors 250, 260 and inductor 265), which enables providing the positive terminal of the differential output pair 233/252.

It may be appreciated that the use of an additional path (auxiliary arm noted above) may increase (e.g., double) the power consumed by amplifier 200 in comparison with an implementation that requires the use of only transistors 230 and 220. Further, since transistors are active devices, the use of transistors 250 and 260 (in addition to transistors 230 and 220) may also increase the noise contribution of the amplifier 200. Thus, amplifier 200 may have a higher-than-desired power consumption as well as a higher noise figure (NF).

Figure 3:
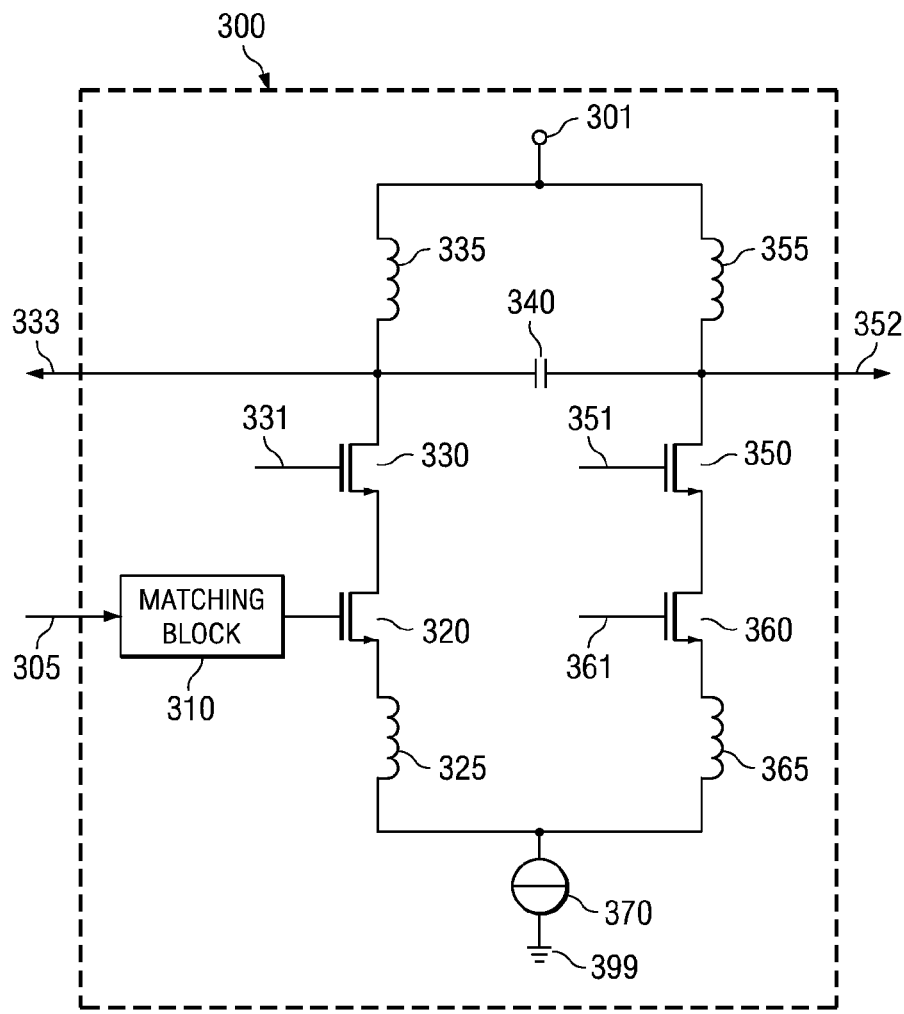
FIG. 3 is a circuit diagram illustrating the details of another prior amplifier with single-ended input and differential output.

FIG. 3 is a diagram illustrating the details of another prior amplifier 300. Prior amplifier 300 (which may be designed to be a low noise amplifier) is shown containing matching block 310, transistors 320, 330, 350 and 360, inductors 335 and 355, inductors 325 and 365, capacitor 340, and constant current source (or constant current sink) 370. Terminals 301 and 399 respectively represent power supply and ground terminals.

Matching block 310, transistors 320, 330, 350 and 360, inductors 335 and 355, inductors 325 and 365, and capacitor 340 operate similar to matching block 210, transistors 220, 230, 250 and 260, inductors 235 and 255, inductors 225 and 265, and capacitor 240 of amplifier 200 (FIG. 2). Transistors 330, 350 and 360 are provided a fixed bias via their respective gate terminals 331, 351 and 361.

In operation, amplifier 300 provides a 180 degrees phase shifted version of input 305 at (negative) output node 333, in a manner similar to that noted with respect to amplifier 200 (FIG. 2). Constant current sink 370 operates in a manner such that when current in the main arm (containing transistors 330, 320 and inductor 325) is increasing, current in the auxiliary arm (containing transistors 350, 360 and inductor 365) decreases. As a result, (positive) output node 352 provides a 0 degrees phase-shifted version of signal 305, differential output pair 333/352 thus providing an amplified version of single-ended signal 305.

Amplifier 300 may also consume more power and have a higher noise figure, for reasons similar to those noted above with respect to amplifier 200 (FIG. 2).

Other prior approaches to provide a single-ended to differential output amplifier, use a balun (generally a 4-terminal component) at the output of a single-ended amplifier's tuned load. However, such an approach also may suffer from similar drawbacks as noted above, while also increasing component count.

Single-ended to differential amplifiers provided according to several aspects of the present invention overcome some of the disadvantages noted above and/or meet some of the general requirements noted above, as described next.

4. Improved Single-Ended Input to Differential Amplifier

Figure 4:
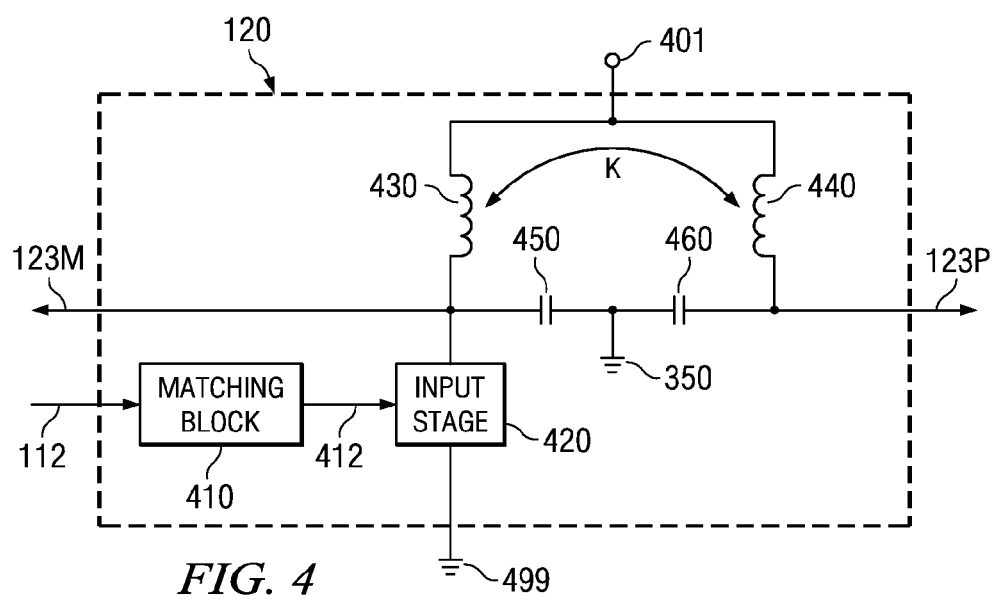
FIG. 4 is a circuit diagram illustrating the topology of a single-ended input to differential output amplifier in an embodiment of the present invention.

FIG. 4 is a circuit diagram illustrating the topology of a single-ended input to differential output amplifier in an embodiment of the present invention. Amplifier 120 is shown containing matching block 410, input stage 420, mutually coupled inductors 430 and 440, and capacitors 450 and 460. Terminals 401 and 499 respectively represent power supply and ground terminals, each of which may be viewed as a corresponding reference potential.

Matching block 410 receives input 112 (e.g., from antenna 110 of FIG. 1) in single ended form, and provides a controlled impedance path (impedance matching) for input 112. Input 112 is passed via matching block 410 to input stage 420 via path 412. Matching block 410 may be implemented using well-known techniques (e.g., micro-strip line, strip-line techniques, or using inductors, capacitors, etc.) in the relevant arts. The use of matching block 410 may be optional, and in some embodiments of the present invention, signal 112 may be directly provided to input stage 420.

Input stage 420 receives signal 412, and provides a 180 degrees phase shifted signal at node 123M. Input stage 420 may contain one or more active components (such as transistors), and provides a desired gain (and hence may be viewed also as a "gain stage") to the signal on path 412. Input stage 420 may be implemented according to one of several well known techniques, such as common-source low noise amplifier configuration, common-gate amplifier configuration, etc. The internal details of an input stage in one embodiment of the present invention are described in sections below.

Inductors 430 and 440 together with capacitors 450 and 460 present a tuned load (filter) to input stage 420, with the respective values of inductors 430/440 and capacitors 450/460 being selected corresponding to a band of frequencies containing a signal of interest received on path 112. As may be appreciated, the combination of the capacitors and inductors operate as a filter to pass the band of frequencies (noted above), while attenuating the remaining frequencies.

Inductors 430 and 440 are mutually coupled, with the co-efficient of coupling being 'K', as denoted in FIG. 4. Inductors 430 and 440 may be implemented, for example, using a single centre-tapped inductor (a 3-terminal component), with the centre tap connected to power supply 401). Assuming the sum of inductances of inductors 430 and 440 is 'L', 'L' may be expressed by the equation below:

$$L = L430 + (K*L440) \qquad \text{Equation 1}$$

Wherein,
L430 is the inductance of inductor 430,
L440 is the inductance of inductor 440,
K is the coefficient of coupling, and
'*' represents a multiply operation.

Mutual coupling sense of inductors 430 and 440 is provided such that an increase in voltage at the terminal of inductor 430 connected to node 123M causes a corresponding decrease at the terminal of inductor 440 connected to node 123P. In other words, the coils/winding direction can be positioned such that inverse correlation is obtained, as is well known in the relevant arts.

As a result, the signal at node 123P is 180 degrees phases shifted with respect to the signal at node 123M. As noted above, signal at node 123M is 180 degrees phases shifted with respect to the signal 112 (or 412). Thus, signal at node 123P is at 0 degrees with respect to signal 112, and 123P/123M provide amplified signal 112 (amplification performed by input stage 420) in a differential form. Paths 123P and 123M are deemed to be contained in path 123 of FIG. 1.

It may be appreciated that the circuit of FIG. 4 does not have an auxiliary arm and corresponding additional active elements (as noted above with respect to the prior amplifiers of FIGS. 2 and 3) to generate the in-phase component (123P) of the differential output 123P/123M. Instead, mutually coupled inductors 430 and 440 (which are passive elements and form part of the load to the gain stage (input stage 420)) are used to provide the in-phase component 123P. As a result, the power consumption of the circuit of FIG. 4 is less when compared to the power consumption in the prior approaches noted above (FIGS. 2 and 3).

Further, since there is no auxiliary arm containing additional active elements, the noise figure is also lower in comparison with the prior approaches. Component count, and therefore implementation area is also less when compared with the prior approaches noted above. Output 123P/123M being in differential form provides better common-mode noise (e.g., due to power supply noise, substrate noise, etc) rejection.

In an embodiment, inductance L (noted above in equation 1) has a value in the range 2 nH (nano Henry) to 50 nH, coupling coefficient K has a value in the range 0.7 to 0.85, and capacitors 450 and 460 are tunable (corresponding capacitances adjustable) to correspond to the band of interest, noted above.

It should be appreciated that the inductors and capacitors together represent a set of impedances according to an example topology providing the various features described herein. However, alternative implementations with different components/topologies can be implemented without departing from the scope and spirit of several aspects of the present invention, as will be apparent to one skilled in the relevant arts by reading the disclosure provided herein. For example, the capacitor combination of 450 and 460 may be replaced by a single capacitor, as described below with an example topology.

Figure 5:
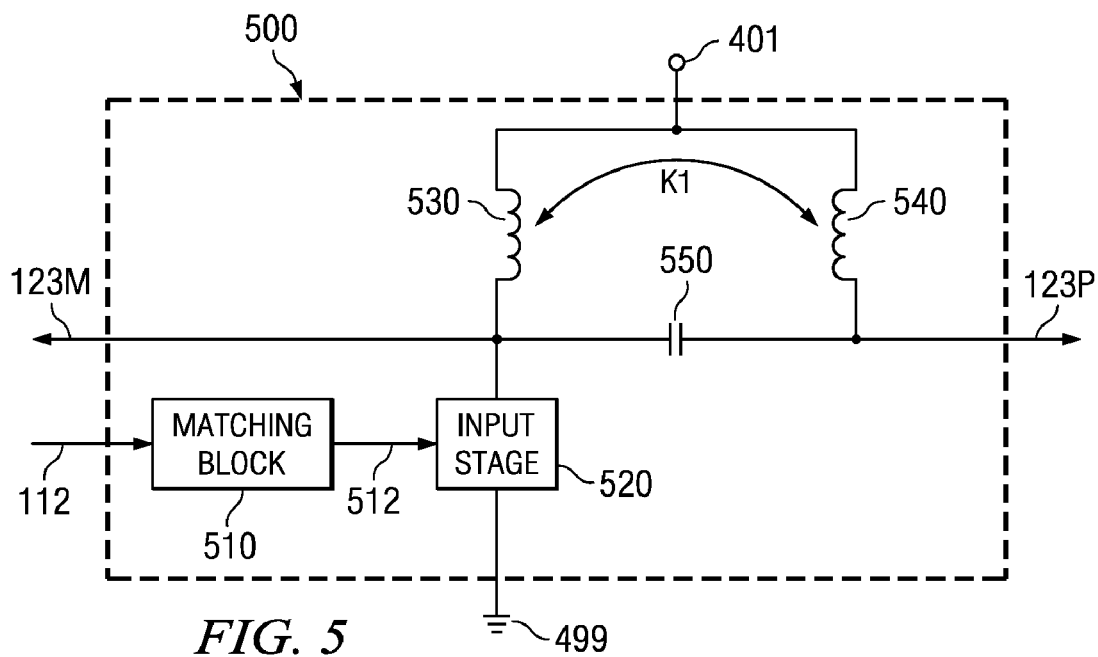
FIG. 5 is a circuit diagram illustrating an alternative topology of a single-ended input to differential output amplifier in an embodiment of the present invention.

FIG. 5 is a circuit diagram illustrating another topology of a single-ended input to differential output amplifier in an embodiment of the present invention. Amplifier 500 is shown containing matching block 510, input stage 520, mutually coupled inductors 530 and 540 (with coefficient of coupling K1), and capacitor 550.

Matching block 510, input stage 520, and mutually coupled inductors 530 and 540 operate similar to matching block 410, input stage 420, and mutually coupled inductors 430 and 440 of FIG. 4. Capacitor 550 is directly connected across the differential output terminals 123P and 123M.

Mutually coupled inductors 530 and 540 (with coupling co-efficient K1) and capacitor 550 together present a tuned load to input stage 520, with the respective values of inductors 530/540 and capacitor 550 being selected corresponding to a desired band of frequencies of signal 112.

It may be appreciated that the topology of FIG. 5 also provides advantages similar to those noted above with respect to FIG. 4, i.e., lower power consumption, lower noise figure, smaller implementation area, better common-mode noise rejection, etc.

The description is continued with an illustration of the internal details of an input stage (gain stage) of an amplifier in an embodiment of the present invention.

5. Example Gain Stage

Figure 6:
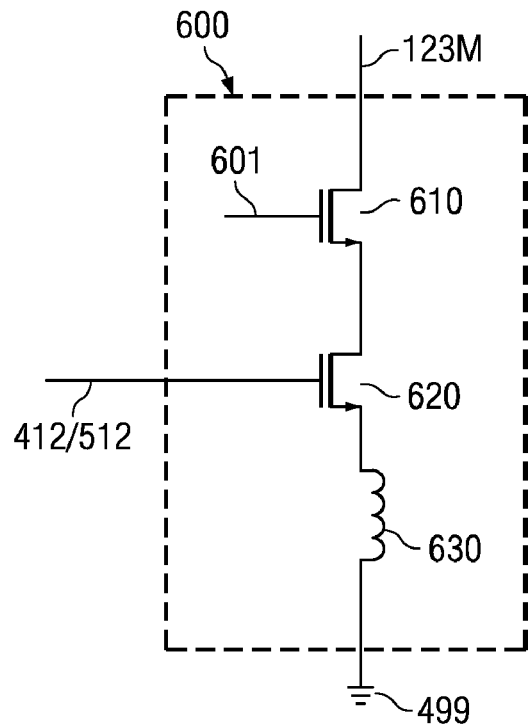
FIG. 6 is a circuit diagram illustrating the details of a gain stage of a single-ended input/differential output amplifier in an embodiment of the present invention.

FIG. 6 is a circuit diagram illustrating the details of a gain stage of a single-ended input/differential output amplifier in an embodiment of the present invention. Gain stage 600 (which may be used in place of input stage 420 of FIG. 4 or input stage 520 of FIG. 5) is shown containing transistors 610 and 620, and inductor 630.

Transistors 620 and 610 are shown connected in a cascode configuration, with transistor 620 configured to operate in a common source configuration, and providing an output to transistor 610 configured to operate in a common gate configuration. The gate terminal (601) of transistor 610 is connected to a constant bias (internally generated, not shown).

Signal 412 or 512 (of FIGS. 4 and 5 respectively) is applied to the gate terminal of transistor 620, and causes a corresponding output current (determined by the transconductance of transistor 620) on path 123M. As noted above, the signal (current/voltage) on node 123M is 180 degrees phase-shifted with respect to signal 412/512. A corresponding 0 degrees phase shifted signal 123P (FIGS. 4 and 5) is provided as described above.

Transistors 610 and 620 may be implemented as N-type MOS (metal oxide semiconductor transistors), and may be implemented to contribute low noise, thereby allowing amplifiers 120 and 500 (FIGS. 4 and 5 respectively) to be used as low-noise amplifiers. It may be appreciated that gain stage 600 when used in place of input stage 420 (or 520) provides an amplifier with half the number of active components (transistors) as the prior amplifiers described above. Thus, power consumption of the amplifiers (420/520) may be reduced by (approximately) half, and noise figure also reduced.

Thus, several aspects of the present invention provide an amplifier with reduced power consumption, lower noise, and smaller implementation area. RF receiver 100 (FIG. 1) incorporating an LNA as described above may have a correspondingly smaller power consumption, and greater sensitivity (due to lower noise figure of LNA) to input signals.

It should be appreciated that the specific type of transistors (NMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as reference potentials, the source and drain terminals of transistors (though which a current path is provided when turned on and an open path is provided when turned off) are termed as current terminals, and the gate terminal is termed as a control terminal. Furthermore, though the terminals are shown with direct connections to various other terminals, it should be appreciated that additional components (as suited for the specific environment) may also be present in the path, and accordingly the connections may be viewed as being electrically coupled to the same connected terminals.

In addition, the circuit topologies of FIGS. 4 and 5 are merely representative. Various modifications, as suited for the specific environment, without departing from the scope and spirit of several aspects of the present invention, will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An amplifier to amplify an input signal in a single ended form and generate an amplified output signal in differential form on a pair of output paths, said amplifier comprising:

a gain stage coupled to receive said input signal and to provide a gained signal on a first output path contained in said pair of output paths; and a pair of mutually coupled inductors coupled to receive said gained signal and to provide a signal 180 degrees phase shifted with respect to said gain signal on a second output path contained in said pair of output paths.

2. An amplifier to amplify an input signal in a single ended form and generate an amplified output signal in differential form on a pair of output paths, said amplifier comprising:

a gain stage coupled to receive said input signal and to provide a gained signal on a first output path contained in said pair of output paths; and a set of passive impedances coupled to said first output path and to provide a tuned load to said gain stage such that only a desired band of frequencies contained in said input signal are received on said first output path, said set of passive impedances further designed to provide a second signal 180 degrees phase shifted with respect to said gain signal on a second output path contained in said pair of output paths, whereby said gained signal and said second signal together represent said amplified output signal in said differential form.

3. The amplifier of claim 2, wherein said set of passive impedances comprise:

a capacitor having two terminals, a first terminal of said capacitor being coupled to a first node also coupled to said first output path, a second terminal of said capacitor being coupled to a second node also coupled to said second output path;

a first inductor and a second inductor each having a corresponding first terminal coupled to a first reference potential, and a second terminal of said first inductor coupled to said first node and a second terminal of said second inductor coupled to said second node, said first inductor and said second inductor being mutually coupled with a coupling sense such that an increase of strength of a signal on said first node causes a reduction in strength on said second node.

4. The amplifier of claim 3, wherein said capacitor is provided in the form of a plurality of capacitors connected in series, and a junction of a pair of said plurality of capacitors being connected to a second reference potential.

5. The amplifier of claim 3, wherein said first inductor and said second inductor are provided in the form of single three terminal centre-tapped inductor with one terminal being connected to said first reference potential and the remaining two terminals being respectively connected to said first node and said second node.

6. The amplifier of claim 3, further comprising a matching block to provide a matched impedance path to said input signal.

7. The amplifier of claim 3, wherein said gain stage is provided in the form of a set of transistors connected in a cascode connection.

8. A receiver comprising:
   an antenna to receive an input signal and provide said input signal in single-ended form; and
   an amplifier to amplify said input signal in a single ended form and generate an amplified output signal in differential form on a pair of output paths, said amplifier comprising:
   a gain stage coupled to receive said input signal and to provide a gained signal on a first output path contained in said pair of output paths; and
   a set of passive impedances coupled to said first output path and to provide a tuned load to said gain stage such that only a desired band of frequencies contained in said input signal are received on said first output path,
   said set of passive impedances further designed to provide a second signal 180 degrees phase shifted with respect to said gain signal on a second output path contained in said pair of output paths,
   whereby said gained signal and said second signal together represent said amplified output signal in said differential form.

9. The receiver of claim 8, wherein said set of passive impedances further comprise:
   a capacitor having two terminals, a first terminal of said capacitor being coupled to a first node also coupled to said first output path, a second terminal of said capacitor being coupled to a second node also coupled to said second output path;
   a first inductor and a second inductor each having a corresponding first terminal coupled to a first reference potential, and a second terminal of said first inductor coupled to said first node and a second terminal of said second inductor coupled to said second node,
   said first inductor and said second inductor being mutually coupled with a coupling sense such that an increase of strength of a signal on said first node causes a reduction in strength on said second node.

10. The receiver of claim 9, wherein said capacitor is provided in the form of a plurality of capacitors connected in series, and a junction of a pair of said plurality of capacitors being connected to a second reference potential.

11. The receiver of claim 9, wherein said first inductor and said second inductor are provided in the form of single three terminal centre-tapped inductor with one terminal being connected to said first reference potential and the remaining two terminals being respectively connected to said first node and said second node.

12. The receiver of claim 9, further comprising a matching block to provide a matched impedance path to said input signal.

13. The receiver of claim 9, wherein said gain stage is provided in the form of a set of transistors connected in a cascode connection.

14. The receiver of claim 13, further comprising:
   a mixer to receive said amplified output signal in said differential form, and to convert said output signal to a lower frequency band;
   an intermediate frequency (IF) block to further process said output signal converted to said lower frequency band to provide a final down-converted signal;
   an analog to digital converter (ADC) to generate digital codes representing the strength of said final down-converted signal at corresponding sampling time instances; and
   a processor processing said digital codes to perform a desired operation using said digital codes.

15. The receiver of claim 14, wherein said receiver is a Global Positioning System (GPS) receiver.

* * * * *